United States Patent [19]

Shiratori et al.

[11] Patent Number: 5,422,896
[45] Date of Patent: Jun. 6, 1995

[54] TIMING CHECK CIRCUIT FOR A FUNCTIONAL MACRO

[75] Inventors: Akihiro Shiratori; Junichiroh Ohyama; Shingo Murayama, all of Kanagawa, Japan

[73] Assignee: NEC Corporation, Tokyo, Japan

[21] Appl. No.: 200,000

[22] Filed: Feb. 22, 1994

[30] Foreign Application Priority Data

Feb. 24, 1993 [JP] Japan .................... 5-033865

[51] Int. Cl.⁶ .............................. G06F 11/00
[52] U.S. Cl. .................................... 371/61
[58] Field of Search ............ 371/61, 62, 1, 6, 5.4; 395/550; 364/270, 271.5

[56] References Cited

U.S. PATENT DOCUMENTS

| | | | |
|---|---|---|---|
| 4,109,236 | 8/1978 | Besenfelder et al. | 371/6 |
| 4,580,263 | 4/1986 | Watanabe et al. | 371/6 |
| 4,646,297 | 2/1987 | Palmquist et al. | 371/1 |
| 4,674,036 | 6/1987 | Conforti | 371/7 |
| 4,686,677 | 8/1987 | Flora | 371/61 |
| 4,726,022 | 2/1988 | Chan et al. | 371/62 |
| 4,737,971 | 4/1988 | Lanzafame et al. | 371/1 |
| 4,920,540 | 4/1990 | Baty | 371/61 |
| 5,003,256 | 3/1991 | Merrill | 371/61 |
| 5,122,978 | 6/1992 | Merrill | 371/1 |

OTHER PUBLICATIONS

Malaiya et al "Modeling and Testing for Timing Faults in Synchronous Sequential Circuit" IEEE Design & Test 1984 pp. 62–74.

Jenny "Missing Pulse Detector" IBM Tech. Disclosure Bulletin vol. 2, No. 4 Dec. 1959 pp. 66–67.

Chu et al. "Efficient Timing Analysis for General Synchronous and Asynchronous Circuits" 1990 IEEE pp. 5-4.1–5-4.4.

Primary Examiner—Robert W. Beausoliel, Jr.
Assistant Examiner—Joseph E. Palys
Attorney, Agent, or Firm—Whitham, Curtis, Whitham and McGinn

[57] ABSTRACT

Disclosed is a timing check circuit comprising a signal change detector, connected to a first input terminal, a decision window generator for receiving the output of the signal change detector, a decision condition detector, connected to a second input terminal, and an AND gate for obtaining a logical product of the output of the decision window generator and the output of the decision condition detector. The output of this AND gate is connected to a clock input terminal of a flip-flop of a logic cell in a specific system. When there is an output from the AND gate, it is determined that an error has occurred. With this structure, a timing check system designed on the premise that logic cells in a specific system are used can execute timing check for a functional macro constituted of a combination of logic cells in the specific system.

20 Claims, 8 Drawing Sheets

TIMING CHECK CIRCUIT FOR A FUNCTIONAL MACRO

BACKGROUND OF THE INVENTION

1. Field of the Invention

The present invention relates to a timing check circuit which is used with logic analyzing software premised on the usage of logic cells in a specific system, and, more particularly, to a timing check model for checking the input timing specification, interval specification and setup time specification of a functional macro which is constituted of logic cells in a specific system.

2. Description of the Related Art

Conventionally, the timing check of a functional macro constituted of logic cells in a specific system requires logical connection information of that functional macro and a timing check model. The logical connection information is information on circuit connection which is described in a format specified by logic analyzing software, and can generally be edited arbitrarily by a circuit designer. The timing check model describes an operational timing using a specific language that is specified by the logic analyzing software. In general, the timing check model is provided as a library for a flip-flop system constituting a logic cell in a specific system. Therefore, the circuit designer should newly edit the timing check model of the functional macro. But, it is necessary to describe the timings for all the logical combinations of input signals that define the operational timing, so that it is practically almost impossible to prepare the timing check model.

Conventionally, the timing check model of a functional macro was not normally prepared, and visual timing check was executed by monitoring the input timing of the functional macro at the time of executing the logic check and comparing the timing at the change in the input of a measuring terminal with the specified value of the timing of the functional macro.

To avoid the visual timing check, conventionally, there has been proposed the checking scheme that uses a timing model which has a circuit structure as shown in FIG. 1. In FIG. 1, buffer circuits (delay circuits) 33 and 34 are respectively inserted in a data input terminal 31 and a clock input terminal 32 of a flip-flop (FF) 35 constituting a logic cell in a specific system to constitute an FF 7, and timing check is executed for the FF7. The setup time or hold time for the FF 7, which is equivalent to a logic cell, can be inspected by giving delay values to the delay circuits constituted of the buffer circuits 33 and 34.

Assuming that the setup time for the FF 35 of a logic cell in the specific system is 2 ns, the setup time for the input terminal 31 with respect to the clock input terminal 32 of the FF 7 of the logic cell becomes 5 ns by setting the delay value of the delay circuit 34 to 3 ns, so that a timing check can be executed with the setup time of 5 ns for the FF 7 of the logic cell.

As described above, however, the preparation of a timing check model for a functional macro is practically impossible because it takes a vast amount of time to describe the model and also the check of the propriety of the model itself is necessary. Since the check involving the monitoring of the input timings of a functional macro is a visual-based scheme, a great amount of time for the check is required and the chance of overlooking the comparison result increases.

In the timing check scheme shown in FIG. 1, since the specified value of 5 ns of the setup time of the FF 7 of the logic cell is an offset added to the specified value for the FF 35 of the logic cell, the timing check cannot be carried out accurately. More specifically, while the timing that is to be inspected as a setup time should range from 5 ns before the rising of the clock terminal 32 to that rising for the FF 7 of the logic cell, the check cannot be conducted outside the range of 5 ns before the rising of the clock terminal 32 to 3 ns before that rising for the circuit structure shown in FIG. 1. Further, the check of the delay circuit 34 causes the delay time of the FF 7 of the logic cell to vary, disabling the accurate timing check.

SUMMARY OF THE INVENTION

It is therefore an object of the present invention to provide a timing check circuit which requires no preparation of a timing check model described by a specific language and will perform a timing check easily.

According to the present invention, there is provided a timing check circuit for a functional macro constituted of a combination of logic cells with flip-flops in a specific system. Said timing check circuit comprises:
- a first input terminal to which a to-be-measured signal is input;
- a signal change detector, connected to said first input terminal, for detecting a change in said to-be-measured signal and outputting a detection signal;
- a decision window generator for receiving said detection signal from said signal change detector and outputting a signal of a predetermined width;
- a second input terminal to which a specification determining signal is input;
- a decision condition detector, connected to said second input terminal, for detecting a decision condition based on said specification determining signal and outputting said decision condition; and
- an AND gate for receiving an output of said decision window generator and an output of said decision condition detector and outputting a logical product of said outputs, an output of said AND gate being input to a clock input terminal of said flip-flop of-said logic cell in said specific system.

Since the timing check circuit according to the present invention can execute the timing check when added to a portion that defines circuit connection information of a functional macro, unlike the prior art, this circuit eliminates the need for the preparation of a timing check model described by a specific language, ensuring an easy timing check. This timing check circuit has further advantages that even if the contents of a functional macro are incomplete, a timing check at the input to the functional macro is possible and a cycle-time dependent timing check, which could not be executed conventionally, can be carried out.

DETAILED DESCRIPTION OF THE PREFERRED EMBODIMENTS

Figure 1:
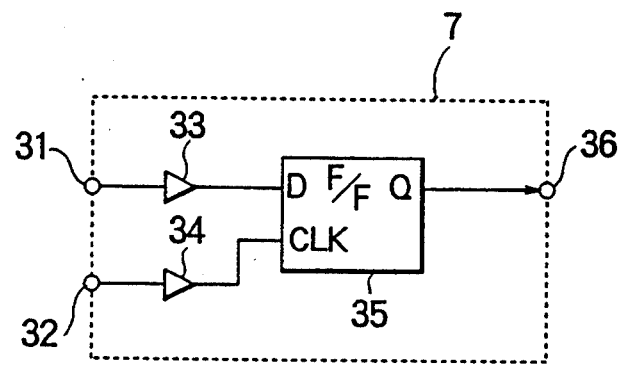
FIG. 1 is a circuit diagram of a conventional timing check circuit.
Figure 2:
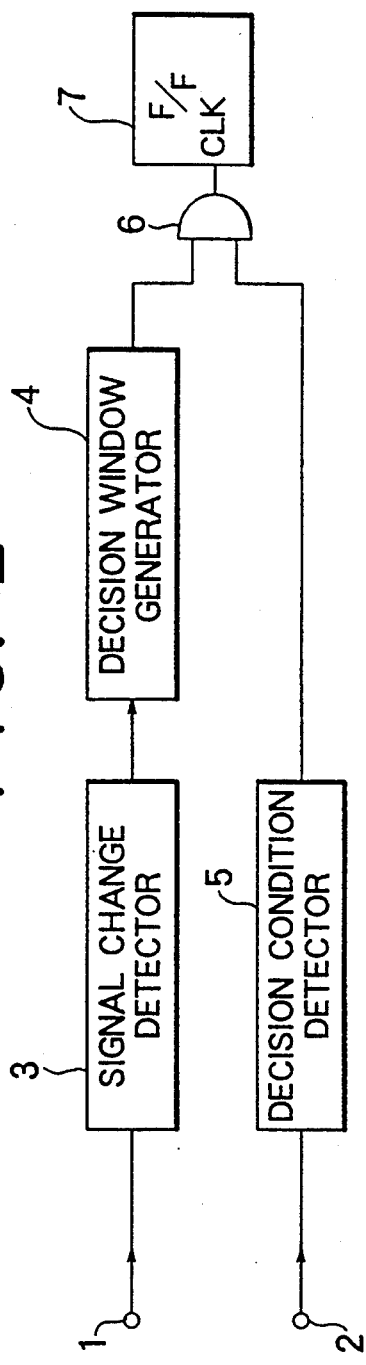
FIG. 2 is a block diagram showing a first embodiment of the present invention.

FIG. 2 is a block diagram showing a first embodiment of the present invention. This embodiment comprises a signal change detector 3 connected to an input terminal 1, a decision window generator 4, which receives the output of the signal change detector 3 as an input, a decision condition detector 5 connected to an input terminal 2, and an AND gate 6, which receives the output of the decision window generator 4 and the output of the decision condition detector 5 as inputs, with the output of the AND gate 6 being connected to a clock input terminal of an FF 7 constituting a logic cell in a specific system. The timing check circuit shown in FIG. 2 is added between timing-check terminals that define circuit connection information to execute timing check.

In FIG. 2, a signal to be subjected to the measurement of a timing specification (hereinafter referred to as "timing-specification measured signal") is input to the input terminal 1, and the signal change detector 3 detects a change in the input logic level of that signal if it occurs and outputs a pulse representing that change. The decision window generator 4 adjusts the width of the input pulse to a pulse width corresponding to the timing specified value and outputs the resultant pulse as a decision window. The input terminal 2 is a timing specification determining terminal, so that when a condition for determining the timing specification is input to this terminal 2, the decision condition detector 5 outputs a pulse with the minimum width allowed by logic check software.

When a pulse is output from the decision condition detector 5 within a period where a decision window is output from the decision window generator 4, it indicates the occurrence of a violation of the input timing specifications of the input terminals 1 and 2 and a pulse having the minimum width is input to the clock input terminal of the FF 7 from the AND gate 6. The minimum value of the width of a clock input pulse supplied to the FF 7 of the logic cell in the specific system is determined in advance, and the specified value is set sufficiently larger than the value of the minimum-width pulse from the AND gate 6. When the pulse from the AND gate 6 is input to the FF 7 at the time of conducting timing check, therefore, an alarm for the FF 7 is generated to indicate that a change in the signal from the input terminal 1 has violated the timing specification decision condition at the input terminal 2.

Figure 3:
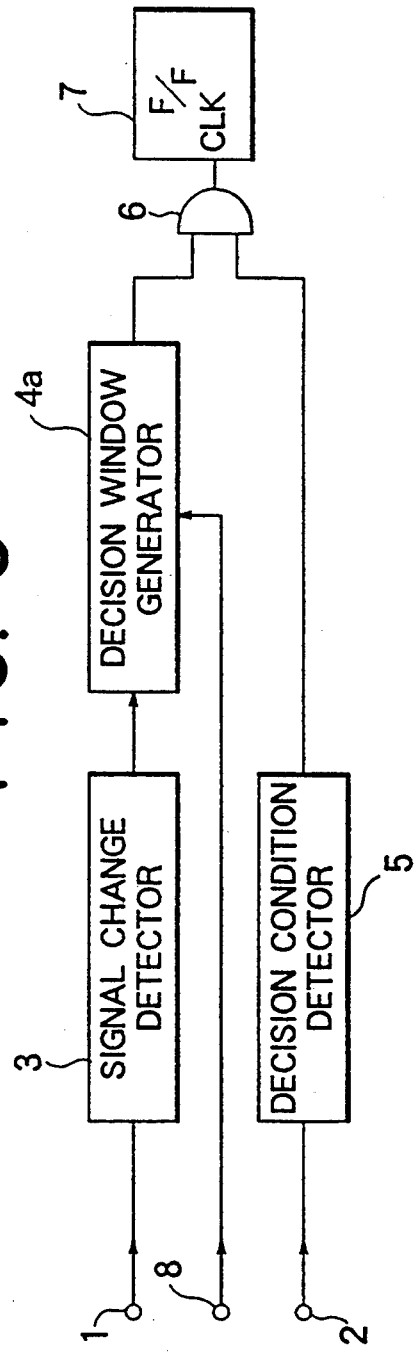
FIG. 3 is a block diagram showing a second embodiment of this invention.

FIG. 3 is a block diagram showing a second embodiment of this invention. In this embodiment, a reference clock input terminal 8 is added and a clock from this input terminal 8 is input to a decision window generator 4a. The input terminal 8 is a reference clock input terminal which is used in setting a specified value concerning the number of cycles. In accordance with a signal change detected by the signal change detector 3, the decision window generator 4a generates a window corresponding to the cycle number of the clock to be supplied from the input terminal 8. This design can ensure a timing check for a specified value that depends on the cycle number of a functional macro.

Figure 4:
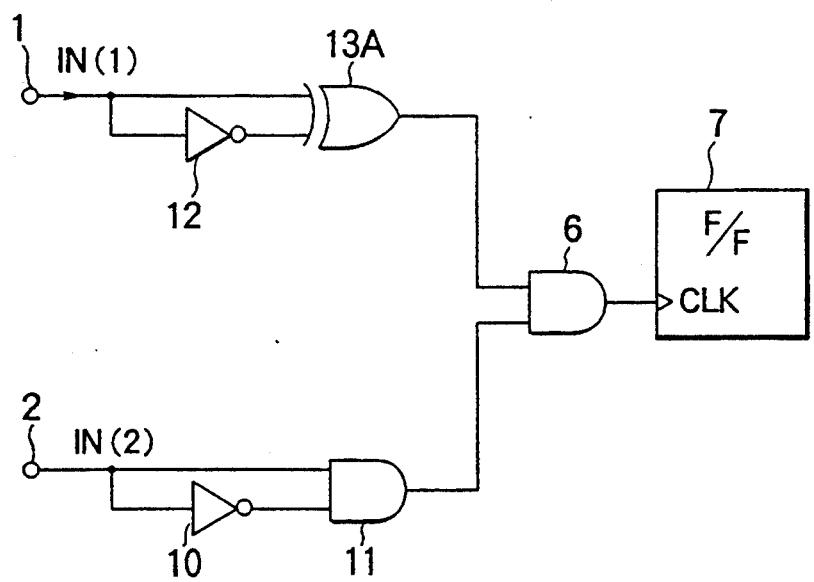
FIG. 4 is a block diagram showing a third embodiment of this invention.
Figure 5:
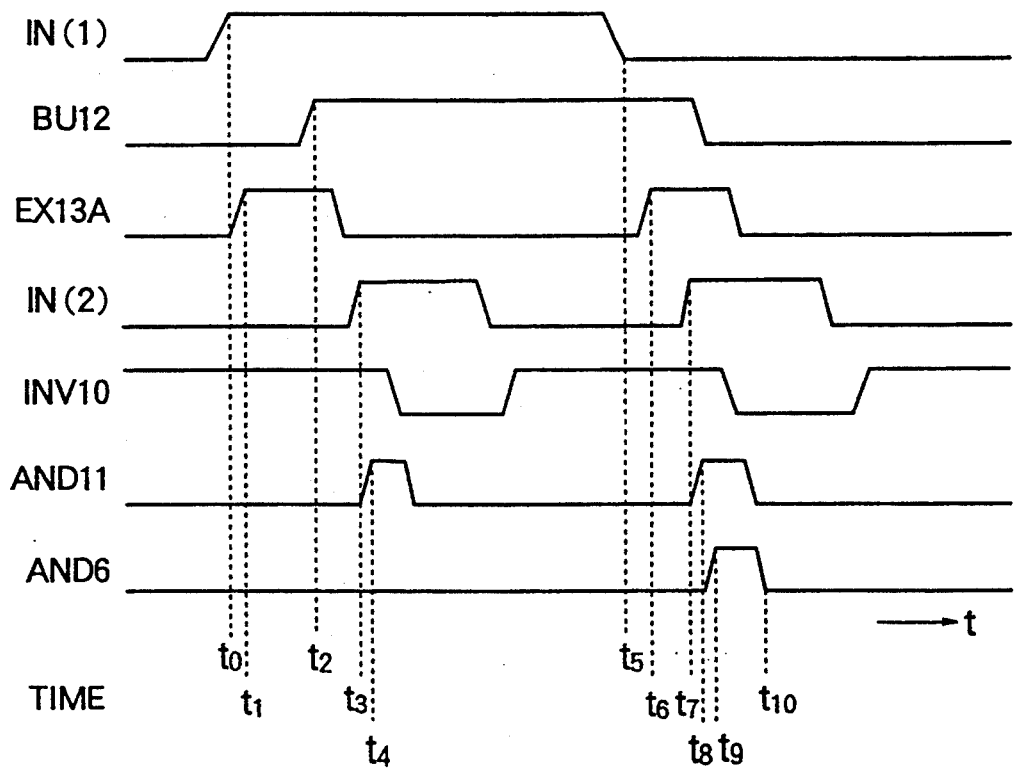
FIG. 5 is a timing chart illustrating an operational example of the third embodiment shown in FIG. 4.

FIG. 4 is a block diagram showing a third embodiment of this invention, and FIG. 5 is a timing chart illustrating an operational example of this embodiment shown in FIG. 4. This circuit inspects the setup time from the point of time when the signal from the input terminal 1 changes to the rising of the input terminal 2. More specifically, this timing check circuit comprises a buffer circuit 12 connected to the input terminal 1, an EXOR (Exclusive OR) gate 13A, which receives the output of the buffer circuit 12 and the signal from the input terminal 1, an inverter 10 for inverting the signal from the input terminal 2, an AND gate 11, which receives the output of the inverter 10 and the Signal from the input terminal 2, and an AND gate 6, which receives the output of the AND gate 11 and the output of the EXOR gate 13A, with the output of the AND gate 6 being connected to a clock input terminal of an FF 7 of the logic cell in the specific system. Assume now that the rising time of the EXOR gate 13A is 1, the falling time is set to a specified value, and delay times for the other circuits 10, 11 and 12 are 1.

In FIG. 4, the input terminal 1 is a terminal to be subjected to the measurement of the setup time specification (hereinafter referred to as "setup-time-specification measured terminal"), and the EXOR gate 13A outputs a pulse for a given period of time when the input logic level varies. The input terminal 2 is a setup time specification determining terminal, and when a condition for determining the setup time specification is input to this terminal 2, the AND gate 11 outputs a pulse with the minimum width allowed by logic check software. When a pulse is output from the AND gate 11 within a period when a pulse is output from the EXOR gate 13A, it indicates the violation of the input timing specifications of the input terminals 1 and 2 and a pulse having the minimum width is input to the clock input terminal of the FF 7 from the AND gate 6. The minimum value of the width of a clock input pulse supplied to the FF 7 of the logic cell in the specific system is determined in advance, and the specified value is set sufficiently larger than the value of the minimum-width pulse from the AND gate 6. When the pulse from the AND gate 6 is input to the FF 7 at the time of conducting a setup timing check, therefore, an alarm for the FF 7 is generated to indicate that a change in the signal from the input terminal 1 has violated the setup time specification decision condition at the input terminal 2.

The circuit operation of this third embodiment will be described below referring to the timing chart given in FIG. 5. Suppose that a timing-specification measured signal IN(1), the output signal BU12 of the buffer circuit 12, the output signal of the EXOR gate 13A, the timing specification determining signal IN(2), the output signal of the AND gate 11 and the output signal of the AND gate 6 are all at a low potential status (hereinafter called "low level"), and the output signal of the inverter 10 is at a high potential status (hereinafter called "high level").

When the input signal IN(1) becomes a high level at time t0, the output signal of the buffer circuit 12 becomes a high level at time t1, so that a change in input signal is detected. When the output signal of the buffer circuit 12 becomes a high level at time t2, the output signal of the EXOR gate 13A becomes a low level.

When the input signal IN(2) becomes a high level at time t3, the output signal of the AND gate 11 becomes a high level at time t4 to determine the setup time specification. As the output signal of the EXOR gate 13A is already at a low level, however, the output signal of the AND gate 6 is kept at a low level, indicating that no timing violation has occurred.

The input signal IN(1) becomes a low level at time t5, and the output signal of the EXOR Gate 13A becomes a high level at time t6. When the input signal IN(2) becomes a high level at time t7, the output signal of the AND gate 11 becomes a high level at time t8. Since the output signal of the EXOR gate 13A is at a high level at this time, the output signal of the AND gate 6 becomes a high level at time t9, indicating that a timing violation has occurred. At time t10, the output signal of the AND gate 6 returns to a low level.

Figure 6:
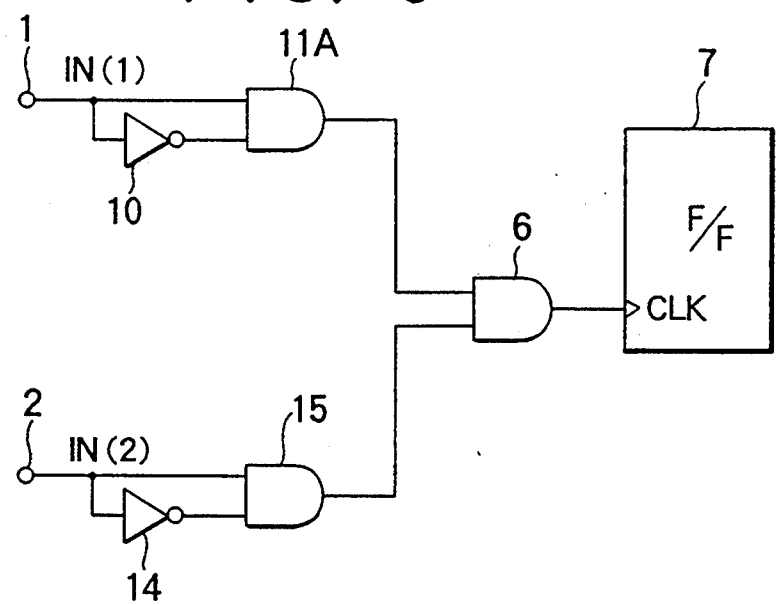
FIG. 6 is a block diagram showing a fourth embodiment of this invention.
Figure 7:
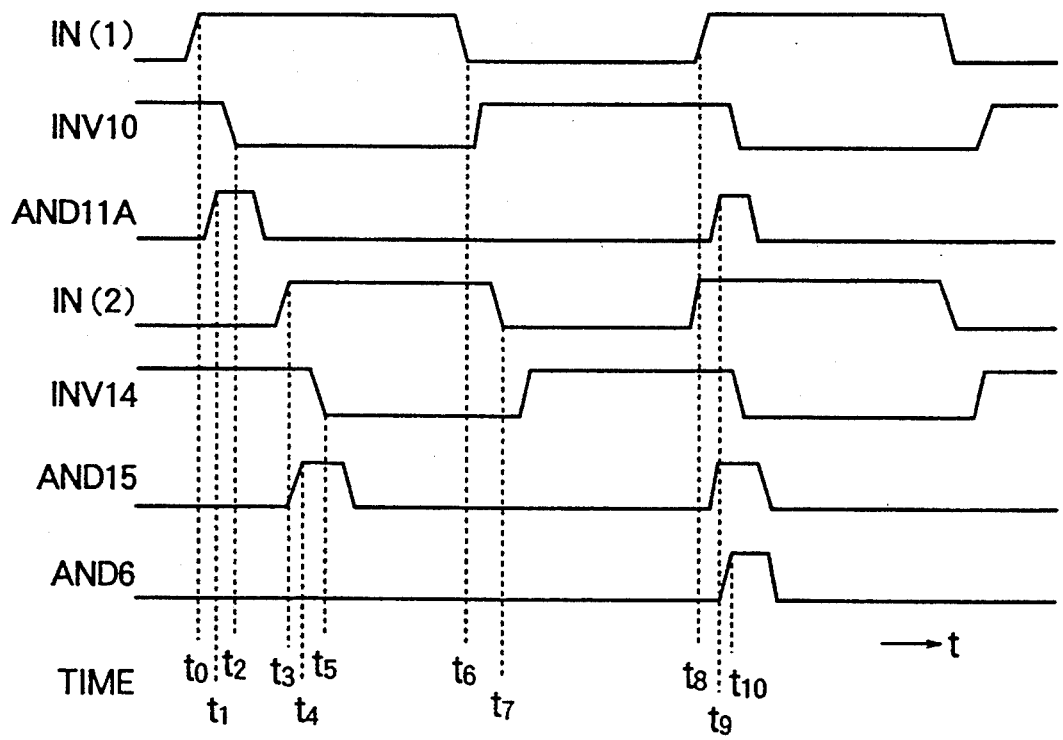
FIG. 7 is a timing chart illustrating an operational example of the fourth embodiment shown in FIG. 6.

FIG. 6 is a block diagram showing a fourth embodiment of this invention, and FIG. 7 is a timing chart showing an operational example of this embodiment in FIG. 6. More specifically, this timing check circuit comprises an inverter 10 connected to the input terminal 1, an AND gate 11A, which receives the output of the inverter 10 and the signal from the input terminal 1, an inverter 14 connected to the input terminal 2, an AND gate 15, which receives the output of the inverter 14 and the signal from the input terminal 2, and an AND gate 6, which receives the output of the AND gate 15 and the output of the AND gate 11A. Assume that the rising time of the AND gate 11A is 1, the falling time is set to a specified value, and delay times for the other circuits 10, 14 and 15 are 1.

The circuit operation of this fourth embodiment will be described below referring to the timing chart given in FIG. 7. Assuming that a setup-time-specification measured signal IN(1), the output signal of the AND gate 11A, the Setup-time specification determining signal IN(2), the output signal of the AND gate 15 and the output signal of the AND gate 6 are all at a low level, then the output signals of the inverters 10 and 14 are at a high level.

When the input signal IN(1) becomes a high level at time t0, the output signal of the AND gate 11A becomes a high level at time t1. When the output signal of the inverter 10 becomes a low level at time t2, the output signal of the AND gate 11A also becomes a low level. When the input signal IN(2) becomes a high level at time t3, the output signal of the AND gate 15 becomes a high level at time t4. As the output signal of the AND gate 11A is already at a low level, however, the output signal of the AND gate 6 is kept at a low level.

When the output signal of the inverter 14 becomes a low level at time t5, the output signal of the AND gate 15 becomes a low level. When the input signal IN(1) becomes a low level at time t6, the output signal of the inverter 10 becomes a high level. When the input signal IN(2) becomes a low level at time t7, the output signal of the inverter 14 becomes a high level. When the input signals IN(1) and IN(2) become a high level at time t8, the output signals of the AND gates 11A and 15 become a high level at time t9. At time t10, the output signal of the AND gate 6 becomes a high level, indicating that a timing violation has occurred.

Figure 8:
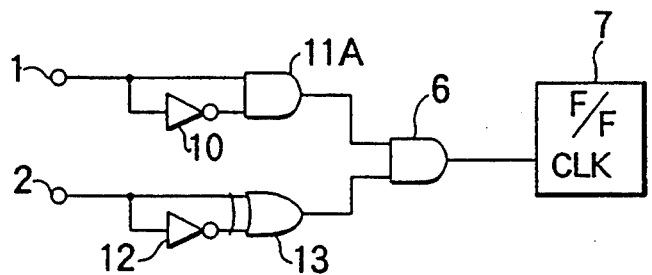
FIG. 8 is a block diagram showing a fifth embodiment of this invention.
Figure 9:
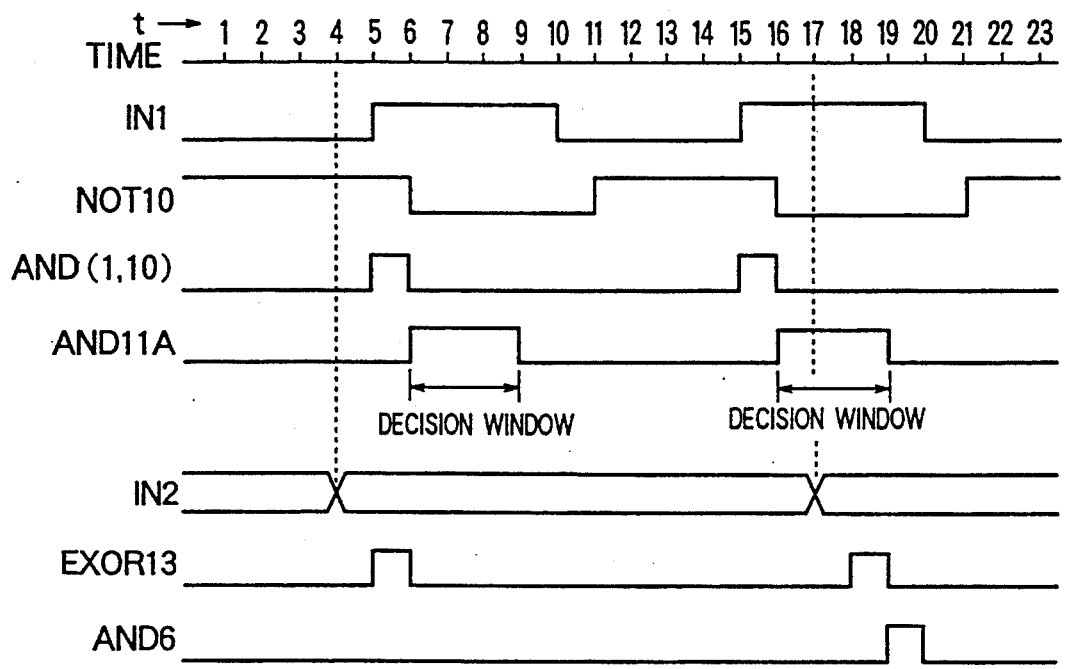
FIG. 9 is a timing chart illustrating an operational example of the fifth embodiment shown in FIG. 8.

FIG. 8 is a block diagram showing a fifth embodiment of this invention, and FIG. 9 is a timing chart illustrating an operational example of this embodiment in FIG. 8. Referring to FIG. 9, the time t on the horizontal scale is an arbitrary unit. This circuit inspects a hold time from the point of time when the signal from the specification determining input terminal 2 has changed to the rising of the to-be-measured input terminal 1. More specifically, this timing check circuit comprises a NOT gate 10 connected to the input terminal 1, an AND gate 11A, which receives the output of the NOT gate 10 and the signal from the input terminal 1, a buffer circuit 12 connected to the input terminal 2, an EXOR gate 13, which receives the output of the buffer circuit 12 and the signal from the input terminal 2, an AND gate 6, which receives the output of the AND gate 11A and the output of the EXOR gate 13, and an FF 7 constituting a logic cell in a specific system. The FF 7 receives the output of the AND gate 6 as its clock input (CLK). This timing check circuit inspects a hold time of the input terminal 2 with respect to the input terminal 1.

Referring to FIG. 8, the AND gate 11A has a falling delay and the delay time determines a decision window. FIG. 9 shows an operational example where the falling delay time of the AND gate 11A is set to "3 units". The input terminal 1 (IN1) rises at time t15, and a change in the signal from the input terminal 2 (IN2) occurs at time t17. As this signal change occurs within the decision window, a pulse is output from the output terminal of the AND gate 6, indicating that an error has occurred.

Figure 10:
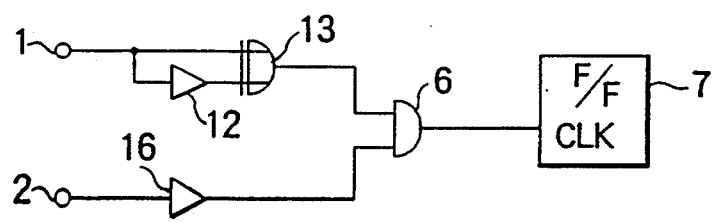
FIG. 10 is a block diagram showing a sixth embodiment of this invention.

FIG. 10 is a block diagram showing a sixth embodiment of this invention. This circuit receives a change inhibiting range as a specification input, and checks if there is a change in data input within this range. This circuit comprises a buffer circuit 12 connected to the input terminal 1, an EXOR gate 13 which obtains an exclusive OR of the output of the buffer circuit 12 and the signal from the input terminal 1, a buffer circuit 16 connected to the input terminal 2, and an AND gate 6 which obtains an AND of the output of the EXOR gate 13 and the output of the buffer circuit 16, with the output of the AND gate 6 being connected to the clock input terminal of an FF 7 of a logic cell in a specific system. The rising delay time of the buffer circuit 16 is "1 unit" added to the specified value. In executing timing check of a functional macro constituted of logic cells in a specific system, the timing check model shown in FIG. 8 is added between the timing check terminals of the portion that defines the logic connection information of the functional macro.

In FIG. 10, when the logic level of the input from the timing-specification measured terminal 1 changes, the EXOR gate 13 detects the change and outputs a pulse representing the change. When the active level of the timing-specification determining terminal 2 is "1," this circuit can detect a change in signal from the input terminal 1. That is, if the signal from the input terminal 1 changes when the input terminal 2 is active, a pulse with the minimum width from the AND gate 6 is input to the clock input terminal of the FF 7. The minimum value of the width of a clock input pulse supplied to the FF 7 of the logic cell in the specific system is determined in advance, and the specified value is set sufficiently larger than the value of the minimum-width pulse from the AND gate 6. When the pulse from the AND gate 6 is input to the FF 7 at the time of conducting timing check, therefore, an alarm for the FF 7 is generated to indicate that a change in the signal from the input terminal 1 has violated the timing specification decision condition at the input terminal 2.

Figure 11:
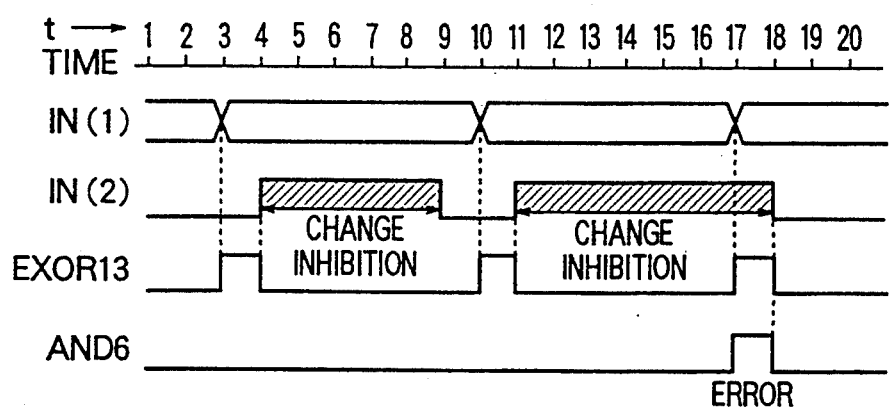
FIG. 11 is a timing chart illustrating an operational example of the sixth embodiment shown in FIG. 10.

FIG. 11 is a timing chart illustrating an operational example of the sixth embodiment shown in FIG. 10. In FIG. 11, the normal operation continues without any error output until time t15, but the signal from the input terminal 1 changes at time t17. As the input terminal 2 at this time has a reference logic level of "1," the AND gate 6 outputs a pulse indicating the occurrence of an error.

Figure 12:
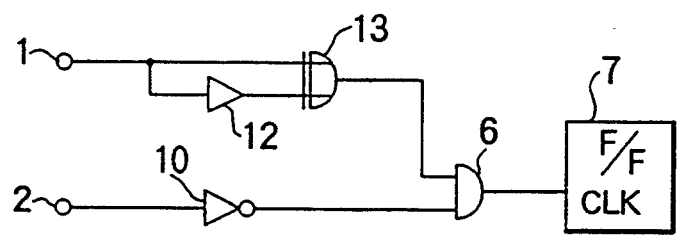
FIG. 12 is a block diagram showing a seventh embodiment of this invention.

FIG. 12 is a block diagram showing a seventh embodiment of this invention. This embodiment uses a NOT gate (inverter) 10 in place of the buffer circuit 16 in FIG. 10. In this case, this circuit can detect if there is a change in signal from the input terminal 1 when the reference logic level of the signal from the input terminal 2 is "0."

Figure 13:
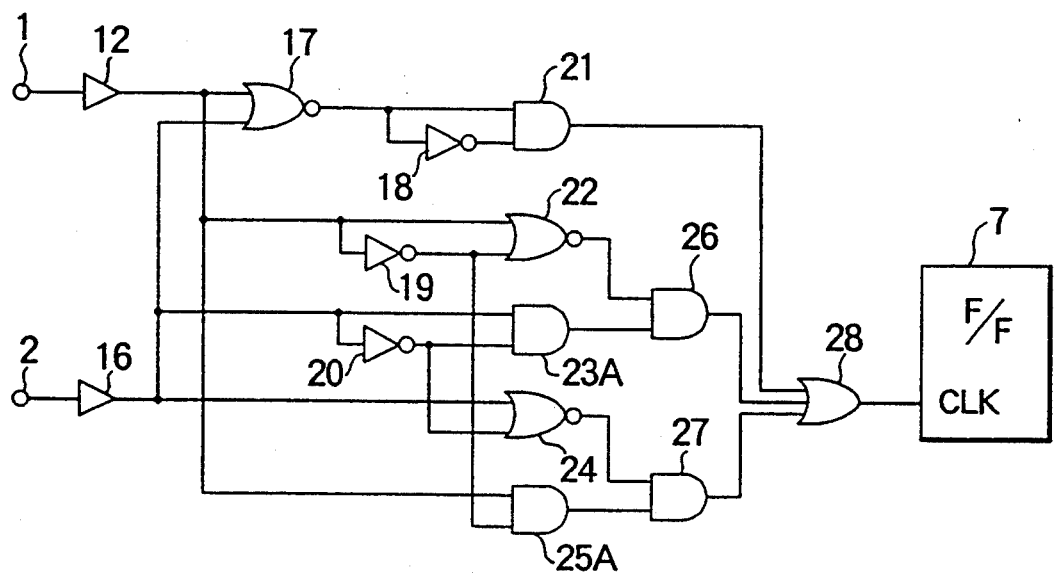
FIG. 13 is a block diagram showing an eighth embodiment of this invention.
Figure 14:
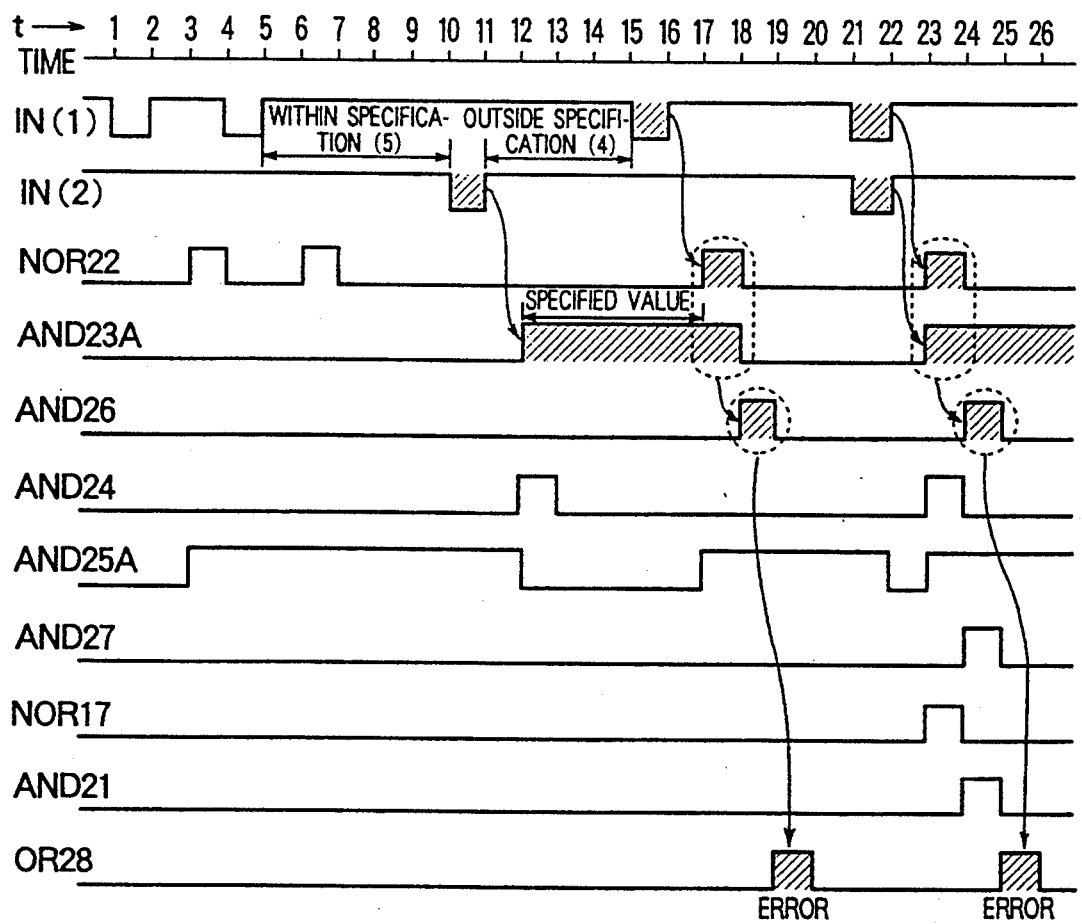
FIG. 14 is a timing chart illustrating an operational example of the eighth embodiment shown in FIG. 13.

FIG. 13 is a block diagram showing an eighth embodiment of this invention, and FIG. 14 is a timing chart illustrating an operational example of this embodiment in FIG. 13. This circuit inspects the period from the rising of the input data (specified) to the falling of the input specified value (data), or a high-level interval time from the rising of the input data (specified) to the falling of the input specified value (data).

This circuit comprises a buffer circuit 12 which receives the signal from the input terminal 1, a buffer circuit 16 which receives the signal from the input terminal 2, a NOR gate 17 which receives the outputs of both buffer circuits 12 and 16, an inverter 18 which receives the output of the NOR gate 17, an AND gate 21 which receives the output of the NOR gate 17 and the output of the inverter 18, an inverter 19 which receives the output of the buffer circuit 12, an inverter 20 which receives the output of the buffer circuit 16, a NOR gate 22 which receives the outputs of both buffer circuit 12 and the inverter 19, an AND gate 23A which receives the output of the buffer circuit 16 and the output of the inverter 20, a NOR gate 24 which receives the outputs of the buffer circuit 16 and the output of the inverter 20, an AND gate 25A which receives the output of the buffer circuit 12 and the output of the inverter 19, an AND gate 26 which receives the outputs of the AND gate 23A and the NOR gate 22, an AND gate 27 which receives the outputs of the NOR gate 24 and the AND gate 25A, an OR gate 28 which receives the outputs of the AND gates 21, 26 and 27, and an FF 7 which receives the output of the OR gate 28.

Referring to FIG. 14, a description will now be given of an operation of executing a timing check of the interval times of the timing check terminals 1 and 2 of the portion that defines the circuit connection information of a functional macro constituted of logic cells in a specific system, with this timing check circuit added between the timing check terminals 1 and 2. In FIG. 14, the specified value of the interval time is "5", the delay times of the AND gates 23A and 25A are set to "specified value+1", and the delay values for the other logic circuits are set to "1".

When the logic level of the input IN(2) at the input terminal 2 changes from "H" to "L" as indicated by times t10–11, the signal from the AND gate 23A with the pulse width corresponding to "specified value+1" changes from "L" to "H" as indicated by times t12–18. When the logic level of the input In(1) at the input terminal 1 changes from "H" to "L" as indicated by times t15–16, the signal from the NOR gate 22 with the pulse width of "1" changes from "L" to "H" as indicated by times t17–18.

When an "H"-level pulse is output from the NOR gate 22 within the period in which an "H"-level pulse is output from the AND gate 23A, which indicates that there is a specification violation on the interval times of the input terminals 1 and 2, the pulse having a width of "1" from the AND gate 26 changes from "L" to "H" as indicted by times t18–19 and a pulse having a width of "1" from the OR gate 28 changes from "L" to "H" as indicated by times t19–20. This pulse from the OR gate 28 is input to the FF 7.

The width of the clock input pulse supplied to the FF 7 of the logic cell in the specific system is "1" and the specified pulse width is "5." When the pulse from the OR gate 28 is input to the FF 7 in the interval time check at the time of conducting timing check, therefore, an alarm for the FF 7 is generated to indicate that a change in the signal from the input terminal 2 has violated the specification decision condition for the interval time at the input terminal 1.

Likewise, when the logic levels of the signals from the input terminals 1 and 2 change from "H" to "L" as indicated by times t21–22, the signal from the NOR gate 22 changes from "L" to "H" with the pulse width as indicated by times t23–34. In the AND gate 23A, the signal changes from "L" to "H" with a pulse width corresponding to "specified value+1." When an "H"-level pulse is output from the NOR gate 22 within the period in which an "H"-level pulse is output from the AND gate 23A, which indicates that there is no interval time for the input terminals 1 and 2. When the pulse from the OR gate 28 is input to the FF 7, an alarm for the FF 7 is generated to indicate the occurrence of a timing violation for the specification decision condition for the interval times of the input terminals 1 and 2.

Figure 15:
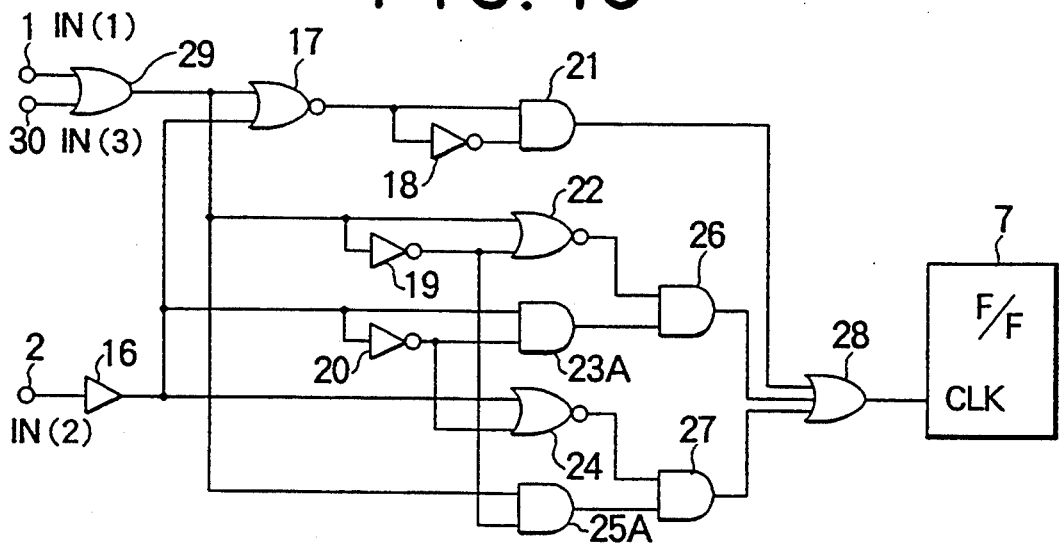
FIG. 15 is a block diagram showing a ninth embodiment of this invention.
Figure 16:
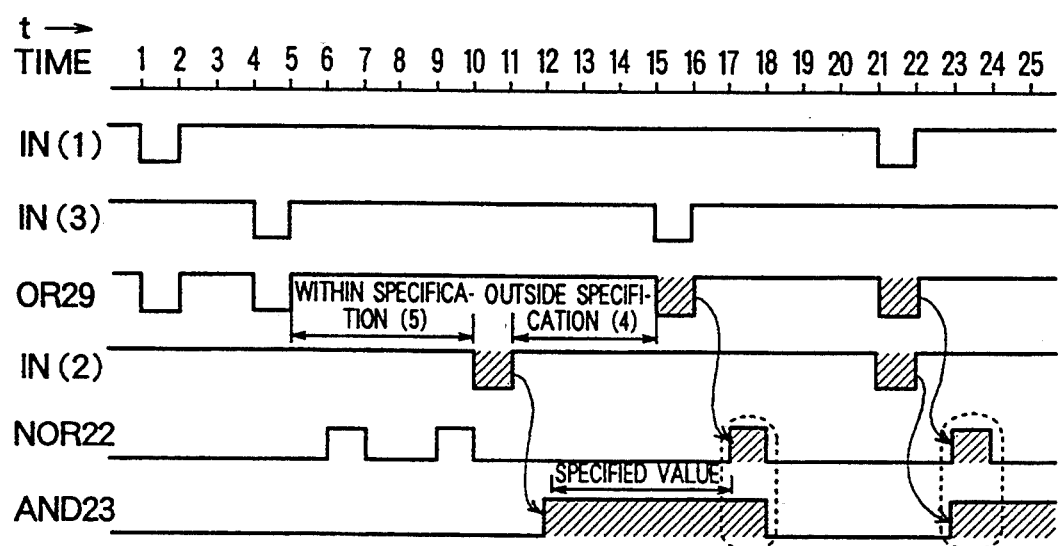
FIG. 16 is a timing chart illustrating an operational example of the ninth embodiment shown in FIG. 15.

FIG. 15 is a block diagram showing a ninth embodiment of this invention, and FIG. 16 is a timing chart illustrating an operational example of this embodiment in FIG. 15. In this embodiment, an input terminal 30 is added to the embodiments shown in FIG. 13 and the buffer circuit 12 is changed to an OR gate 29. This circuit performs timing check of the interval time from the rising of the signals from the input terminals 1 and 30 to the falling of the signal from the input terminal 2.

The results of ORing the input signals IN(1) and IN(3) of the input terminals 1 and 30 by the OR gate 29 in FIG. 15 are expressed by the timing chart of the OR gate 29 given in FIG. 16. This is the same as the timing chart for the input signal IN(1) of the input terminal 1 in FIG. 14, and this embodiment has the same advantage as the embodiment shown in FIG. 13. Therefore, a timing violation on the specification condition of the interval times of the input terminal 2 with respect to the input terminals 1 and 30 is inspected.

What is claimed is:

1. A timing check circuit for a functional macro comprising a combination of logic cells including flip-flops in a specific system, comprising:
   a first input terminal to which a to-be-measured signal is input;
   a signal change detector, connected to said first input terminal, for detecting a change in said to-be measured signal and outputting a detection signal;
   a decision window generator for receiving said detection signal from said signal change detector and outputting a signal of a predetermined width;
   a second input terminal to which a specification determining signal is input;
   a decision condition detector, connected to said second input terminal, for detecting a decision condition based on said specification determining signal and outputting a signal representing said decision condition; and
   an AND gate for receiving said signal outputted from said decision window generator and said signal outputted from said decision condition detector and outputting a logical product thereof, said output of said AND gate being input to a clock input terminal of a flip-flop of said logic cell in said specific system.

2. The timing check circuit according to claim 1, wherein said timing check circuit further comprises a third input terminal and said decision window generator outputs a decision window of a time width having a number of cycles corresponding to a reference clock signal supplied to said third input terminal.

3. The timing check circuit according to claim 1, wherein said signal change detector and said decision window generator have an exclusive OR gate for obtaining an exclusive logical sum of said to-be-measured signal and an output thereof.

4. The timing check circuit according to claim 1, wherein said signal change detector and said decision window generator have an AND gate for obtaining a logical product of said to-be-measured signal and an inverted output thereof.

5. The timing check circuit according to claim 4, wherein said AND gate outputs a window signal which is a logical product delayed.

6. The timing check circuit according to claim 1, wherein said decision condition detector has an AND gate for obtaining a logical product of said specification determining signal and an inverted output thereof.

7. The timing check circuit according to claim 6, wherein said decision condition detector has an inverter for inverting said specification determining signal.

8. The timing check circuit according to claim 1, wherein said decision condition detector has an exclusive OR gate for obtaining an exclusive logical sum of said specification determining signal and a buffer output thereof.

9. The timing check circuit according to claim 8, wherein said decision condition detector has a buffer circuit for amplifying said specification determining signal.

10. A timing check circuit for a functional macro comprising a combination of logic cells including flip-flops in a specific system, comprising:
    a first input terminal to which a first input signal is input;
    a second input terminal to which a second input signal is input;
    a falling detector for detecting a falling of said first input signal from said first input terminal;
    a high-level width determining period generator for generating a high-level width determining period based on said first input signal from said first input terminal;
    a rising detector for detecting a rising of said second input signal from said second input terminal;
    a low-level width determining period generator for generating a low-level width determining period based on said second input signal from said second input terminal;
    a high-level width determining circuit for determining a high-level width based on an output of said falling detector and an output of said high-level width determining period generator, and for outputting a signal representative thereof;
    a low-level width determining circuit for determining a low-level width based on an output of said rising detector and an output of said low-level width determining period generator, and for outputting a signal representative thereof; and
    an OR gate for outputting a logical sum of said signal output from said low-level width determining circuit and said signal output from said high-level width determining circuit,
    said output of said OR gate being input to a clock input terminal of a flip-flop of said logic cell in said specific system.

11. A timing check circuit for a functional macro comprising a combination of logic cells including flip-flops in a specific system, comprising:
    a first input terminal to which a to-be-measured signal is input;
    a signal change detector, connected to said first input terminal, for detecting a change in said to-be measured signal and outputting a detection signal;
    a decision window generator for receiving said detection signal from said signal change detector and outputting an output;
    a second input terminal to which a specification determining signal is input;
    a decision condition detector, connected to said second input terminal, for detecting a decision condition based on said specification determining signal and outputting an output representing said decision condition; and
    a logic gate for receiving said output outputted from said decision window generator and said output outputted from said decision condition detector and outputting a logical product of said outputs.

12. The timing check circuit according to claim 11, wherein said logic gate includes an AND gate, said output of said AND gate being input to a clock input terminal of a flip-flop of said logic cell in said specific system.

13. The timing check circuit according to claim 11, wherein said signal change detector and said decision window generator have an exclusive OR gate for obtaining an exclusive logical sum of said to-be-measured signal and an output thereof.

14. The timing check circuit according to claim 11, wherein said signal change detector and said decision window generator have an AND gate for obtaining a logical product to-be-measured signal and an inverted output thereof.

15. The timing check circuit according to claim 14, wherein said AND gate outputs a window signal which is a logical product delayed.

16. The timing check circuit according to claim 11, wherein said decision condition detector has an AND gate for obtaining a logical product of said specification determining signal and an inverted output thereof.

17. The timing check circuit according to claim 16, wherein said decision condition detector has an inverter for inverting said specification determining signal.

18. The timing check circuit according to claim 11, wherein said decision condition detector has an exclusive OR gate for obtaining an exclusive logical sum of said specification determining signal and a buffer output thereof.

19. The timing check circuit according to claim 18, wherein said decision condition detector has a buffer circuit for amplifying said specification determining signal.

20. The timing check circuit according to claim 11, wherein said timing check circuit further comprises a third input terminal and said decision window generator outputs a decision window of a time width having a number of cycles corresponding to a reference clock signal supplied to said third input terminal.

* * * * *